United States Patent
Kang et al.

(10) Patent No.: US 8,658,002 B2
(45) Date of Patent: Feb. 25, 2014

(54) SYSTEM FOR SPUTTERING AND METHOD THEREOF

(75) Inventors: Eu-Gene Kang, Yongin (KR); Won-Hyouk Jang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 382 days.

(21) Appl. No.: 12/911,569

(22) Filed: Oct. 25, 2010

(65) Prior Publication Data

US 2011/0272275 A1 Nov. 10, 2011

(30) Foreign Application Priority Data

May 4, 2010 (KR) .................. 10-2010-0042117

(51) Int. Cl.
*C23C 14/34* (2006.01)

(52) U.S. Cl.
USPC ................................ 204/192.13; 204/298.03

(58) Field of Classification Search
USPC ...................................... 204/192.13, 298.03
See application file for complete search history.

(56) References Cited

U.S. PATENT DOCUMENTS

| | | | |
|---|---|---|---|
| 4,749,663 A | 6/1988 | Okita | |
| 6,903,026 B2 | 6/2005 | Han | |
| 2002/0057393 A1 | 5/2002 | Park et al. | |
| 2004/0239826 A1 | 12/2004 | Park et al. | |
| 2010/0102315 A1 | 4/2010 | Suzawa et al. | |
| 2010/0105162 A1 | 4/2010 | Suzawa et al. | |
| 2010/0105163 A1 | 4/2010 | Ito et al. | |

FOREIGN PATENT DOCUMENTS

| | | |
|---|---|---|
| JP | 10158833 A | 6/1998 |
| KR | 10-0137822 | 2/1998 |
| KR | 10-2001-0107143 | 12/2001 |
| KR | 10-2007-0055010 | 5/2007 |
| KR | 1020080011541 A | 2/2008 |
| KR | 10-2009-0116823 | 11/2009 |

*Primary Examiner* — Rodney McDonald
(74) *Attorney, Agent, or Firm* — Robert E. Bushnell, Esq.

(57) ABSTRACT

A sputtering method includes receiving etch time information for a first substrate detected in a dry etching process, calculating a deposition time for a second substrate from the etch time information for the first substrate, and executing sputtering for the second substrate based the calculated deposition time. The thickness of the thin film deposited on the substrate in the sputter device may be uniformly maintained by using etch end point information detected in an end point detection (EPD) device. A sputtering system comprises a sputter device for executing a sputtering process for depositing a thin film on a substrate by a sputtering method, an EPD device for generating EPD information including etch time information for the substrate for a calculation of a deposition time during which the thin film is deposited, and a controller for calculating a deposition time by using the EPD information, and for controlling the sputter device based on the calculated deposition time.

19 Claims, 2 Drawing Sheets

SYSTEM FOR SPUTTERING AND METHOD THEREOF

CLAIM OF PRIORITY

This application makes reference to, incorporates the same herein, and claims all benefits accruing under 35 U.S.C. §119 from an application earlier filed in the Korean Intellectual Property Office on May 4, 2010 and there duly assigned Serial No. 10-2010-0042117.

BACKGROUND OF THE INVENTION

1. Field of the Invention

The present invention relates to a sputtering system and a sputtering method. More particularly, the present invention relates to a sputtering system and a sputtering method for controlling a deposition time by using an etch rate and an etch time feedback in a dry etching device.

2. Description of the Related Art

A sputtering method is a method used for forming a thin film on a substrate surface such as a glass substrate or a silicon wafer. In the sputtering method, a sputtering gas is supplied to a chamber in a vacuum state, and the target material which sticks out from the target through a collision of the sputtering gas is deposited on the substrate, thereby forming the thin film. Generally, a rare gas, such as argon or xenon, is used as the sputtering gas. To manufacture the thin film, including an oxide or a nitride, a reactive gas such as oxygen or nitrogen may be added along with the rare gas.

In a sputter device, power is applied by using a cathode of the side of the target and an anode of the side of a substrate. If the power is applied, the sputtering gas (Ar) introduced into the chamber impacts electrons emitted from the cathode such that exited $Ar^+$ is formed. The exited gas ($Ar^+$) is drawn to the side of the target as the cathode and impacts the target. The energy of the exited gas is spread to the target because of the collision, and plasma is emitted when the energy can cover the coherence of elements consisting of the target and the work function of the electron. The generated plasma emerges by a mean free path and is attached to the substrate positioned within the mean free path, thereby forming the thin film.

The case in which the power applied to the sputter device is DC power is referred to as a DC sputtering method, and the case in which the power applied to the sputter device is AC power is referred to as an AC sputtering method. Generally, the DC sputtering method is used for sputtering of a conductor, and the AC sputtering method is used for the sputtering of an insulator. There is a magnetron sputtering method used for forming the thin film of the substrate by collecting the generated plasma by means of the flux of a permanent magnet.

On the other hand, a dry etching device selectively removes the thin film formed on the glass substrate or the silicon wafer so as to execute an etch process forming a semiconductor integrated circuit. The dry etching device includes an end point detection (hereafter referred to as EPD) device detecting an end point of the etching of the thin film. The EPD device may detect the time that another layer is exposed from the etched layer through a method such as light detection, current detection, or temperature detection, that is, the etch end point.

In the etch process, the etch degree may be correctly controlled through the EPD method. However, the thickness of the thin film of a monitoring sample is measured in the sputtering method so as to detect the deposition thickness of the thin film such that it is difficult to uniformly maintain the thin film thickness of all substrates.

The above information disclosed in this Background section is only for enhancement of an understanding of the background of the invention, and therefore it may contain information that does not form the prior art which is already known in this country to a person of ordinary skill in the art.

SUMMARY OF THE INVENTION

The present invention provides a sputtering system and a sputtering method capable of uniformly maintaining the thickness of a thin film formed on a substrate.

The sputtering method, according to an exemplary embodiment of the present invention, includes receiving etch time information for a first substrate detected in a dry etching process, calculating a deposition time for a second substrate from the etch time information for the first substrate, and executing sputtering for the second substrate based on the calculated deposition time.

The etch time information may be calculated from an etch end point detected by an end point detection (EPD) device.

The calculation of the deposition time may include calculating the thickness of the thin film formed on the first substrate from the etch time information, and calculating the deposition time for the second substrate from the thickness of the thin film formed on the first substrate.

The deposition time for the second substrate may be the deposition time during which the thin film formed on the second substrate is formed with the same thickness as the thin film formed on the first substrate.

The deposition time for the second substrate may be calculated by $Tp=(Ve*Te+Offset2-Offset1)/Vp$, wherein Tp is the deposition time for the second substrate, Ve is the etch rate in the dry etching process, Te is the etch time for the first substrate, Vp is the deposition speed in the sputtering process, Offset1 is an offset of which the other process variables, except for the deposition time among the process variables related to the thickness of the thin film in the sputtering process, are converted into a unit of the thin film thickness, and Offset2 is an offset to compensate for a deviation amount of the thickness of the thin film etched according to the passage of time in the dry etching process.

The other process variables may include at least one of power amount, introduction amount of the sputter gas, vacuum pressure inside the vacuum chamber, temperature inside the vacuum chamber, and distance between the target and the substrate.

A sputtering method according to another exemplary embodiment of the present invention includes: carrying a substrate to a position facing a target inside a vacuum chamber; forming a predetermined vacuum pressure inside the vacuum chamber; introducing a process gas into the vacuum chamber; applying predetermined power to the target; and forming a thin film on the substrate during a deposition time which is calculated from etch time information detected in a dry etching process.

The etch time information may be etch time information for a previous substrate which undergoes sputtering before the substrate.

The etch time information of the previous substrate which undergoes sputtering may be calculated from an etch end point which is detected by an EPD device in the dry etching process and is transmitted.

The thickness of the thin film formed in the substrate which previously undergoes sputtering may be calculated in terms of the etch time information, and the deposition time may be calculated by dividing a deviation between the calculated thickness of the thin film and a process variable offset of the sputtering process by the deposition speed.

The process variable offset may be an offset of which the other process variables, except for the deposition time, among the process variables in the sputtering process are converted into a unit of the thin film thickness.

A sputtering system according to another exemplary embodiment of the present invention includes: a sputter device for executing a sputtering process for depositing a thin film on a substrate by a sputtering method; an EPD device for generating EPD information including etch time information for the substrate for a calculation of a deposition time during which the thin film is deposited; and a controller for calculating a deposition time by using the EPD information, and for controlling the sputter device based on the calculated deposition time.

The controller may calculate a deposition time for a second substrate which will undergo sputtering from etch time information for a first substrate which previously undergoes sputtering.

The controller may calculate the thickness of the thin film formed on the first substrate from the etch time information for the first substrate, and may divide a deviation between the calculated thickness of the thin film and the process variable offset of the sputtering process by the deposition speed for the calculation of the deposition time.

The thickness of the thin film deposited on the substrate in the sputter device may be uniformly maintained by using the etch end point information detected in the EPD device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
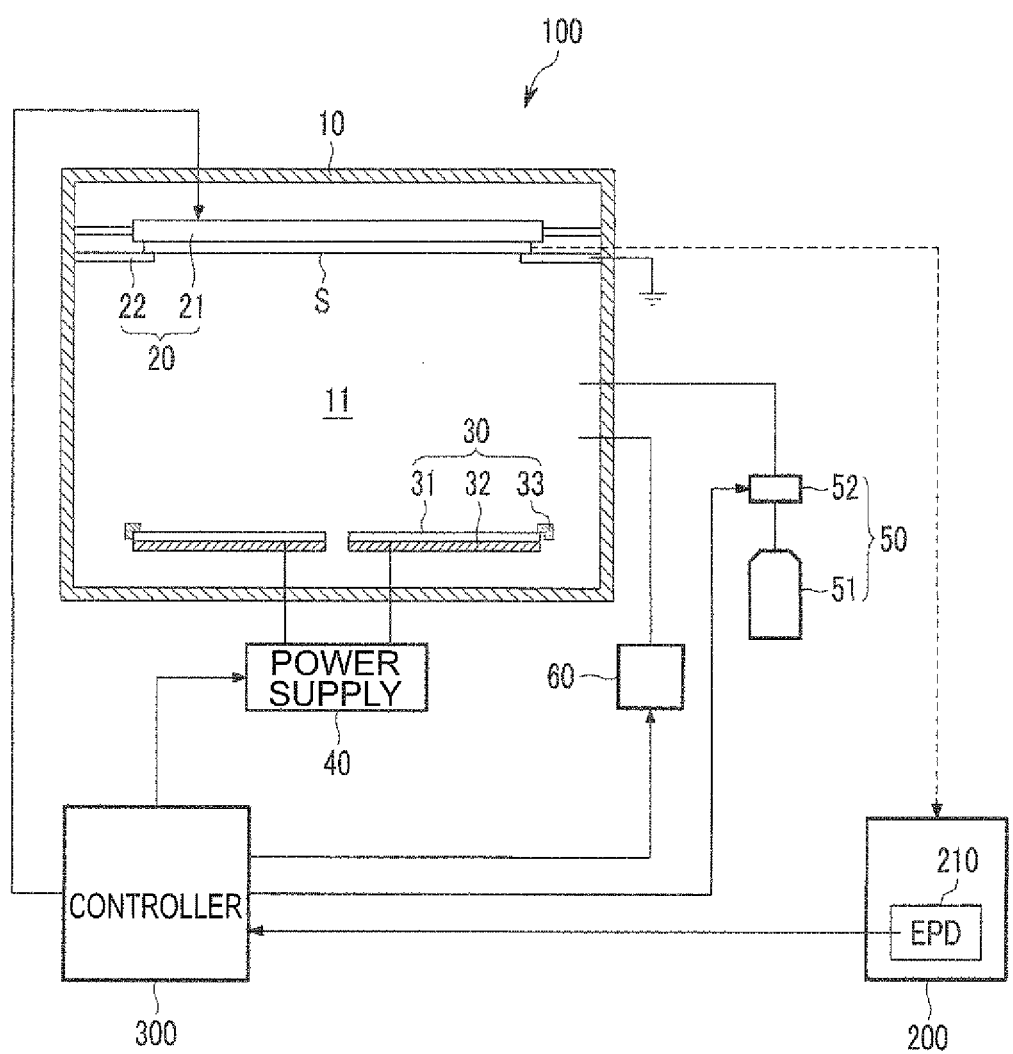
FIG. 1 is a block diagram of a sputtering system according to an exemplary embodiment of the present invention.

Hereinafter, exemplary embodiments of the present invention will be described in detail with reference to the accompanying drawings so that those having ordinary skill in the art to which the present invention pertains will readily appreciate the present invention. The present invention may be implemented in various different forms and is not limited to the exemplary embodiments described herein.

Furthermore, in the embodiments, like reference numerals designate like elements throughout the specification in a representative manner in a first embodiment, and only elements other than those of the first embodiment will be described in subsequent embodiments.

Descriptions of parts not relating to the present invention are omitted, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of a sputtering system according to an exemplary embodiment of the present invention.

Referring to FIG. 1, the sputtering system includes a sputter device 100, an EPD device 210, and a controller 300. The sputter device 100 is a device which executes a sputtering process for depositing a metal thin film on a substrate by means of a sputtering method. The EPD device 210 is a device used for generating EPD information including etch time information and is provided in a dry etching device 200. The EPD information is used for deposition time calculation. The controller 300 calculates the deposition time by using the EPD information, and controls the sputter device 100 according to the calculated deposition time.

The sputter device 100 includes a vacuum chamber 10 which includes a sputter room 11 of a predetermined vacuum state, a substrate transferring unit 20 for carrying the substrate S in and out of the vacuum chamber 10, a cathode electrode 30 having a target 31 and facing the substrate transferring unit 20, a power supply unit 40 for supplying power to the cathode electrode 30, a gas supplying unit 50 for supplying a process gas to the vacuum chamber 10, and a vacuum exhausting unit 60 for forming a predetermined vacuum pressure inside the vacuum chamber 10.

In this regard, it is assumed that the sputter device 100 uses the AC sputtering method. That is, the power supply unit 40 supplies AC power to the cathode electrode 30. However, the present invention is not limited thereto, and the sputter device 100 may used the DC sputtering method or the magnetron sputtering method. When the sputter device 100 uses the DC sputtering method, the power supply unit 40 supplies the DC power to the cathode electrode 30. When the sputter device 100 uses the magnetron sputtering method, a permanent magnet is provided behind the cathode electrode 30 facing the substrate transferring unit 20 (the side opposite the target 31).

The vacuum chamber 10 may maintain the predetermined vacuum pressure and includes of the sputter room 11 where the sputtering is executed. The inside of the vacuum chamber 10 is formed with the predetermined vacuum pressure by the vacuum exhausting unit 60 which is controlled by the controller 300. The vacuum exhausting unit 60 includes a rotary pump and a turbomolecular pump.

The substrate transferring unit 20 is provided on one side (the upper side) inside the vacuum chamber 10. The substrate transferring unit 20 includes a carrier 21 adhering to the substrate S so as to transfer it to a position facing the target 31. The carrier 21 may adhere to and maintain the substrate S in a potential floating state. When forming the thin film on the substrate S, to prevent the sputter particles from being attached to the carrier 21, a mask plate 22 which is grounded is contacted and installed the edge of the substrate S. The substrate transferring unit 20 is controlled by the controller 300, the substrate S for the deposition is transferred inside the vacuum chamber 10, and the substrate S formed with the thin film is carried out of the vacuum chamber 10.

The cathode electrode 30 faces the substrate S and is installed on the other side (the lower side) inside the vacuum chamber 10. The cathode electrode 30 includes a plurality of targets 31 manufactured by the composition of the thin film which will be formed on the surface of the substrate S, a backing plate 32 for cooling each target 31, and a shield 33 which is grounded near each target 31. The cathode electrode 30 is installed such that the distance between the substrate S and the target 31 is within the mean free path of the plasma.

The target 31 may be made of Al, Ti, Mo, indium, or indium tin oxide (ITO), or an alloy of indium and tin. The target 31 may be made with a rectangular shape or a circular shape facing the substrate S. The target 31 is bonded to the backing plate 32 by a bonding agent such as indium or tin.

The power supply unit 40 supplies AC power of a predetermined frequency to the plurality of targets 31. For example, the power supply unit 40 may supply AC power having a waveform of a sine wave or a rectangular wave with a frequency of 13.56 MHz to the plurality of targets 31. The power supply unit 40 is controlled by the controller 300, and controls the AC power supplied to the target 31.

The gas supplying unit 50 includes a gas tank 51 for storing the process gas and a mass flow controller 52 for controlling the flux of the gas. The mass flow controller 52 is connected to a gas pipe installed on the side surface of the vacuum chamber 10, and the gas tank 51 is connected to the gas pipe through the mass flow controller 52. The mass flow controller 52 is controlled by the controller 300, and it controls the amount of gas supplied to the vacuum chamber 10. The process gas includes the sputtering gas such as argon or xenon, and the reactive gas selected to form the thin film including an oxide or a nitride such as $O_2$, $N_2$, and $H_2O$.

In this regard, one gas tank 51 and one mass flow controller 52 are shown. However, the gas supplying unit 50 may include a plurality of gas tanks for storing each sputtering gas and each reactive gas, and a plurality of mass flow controllers for controlling the gas amount of each gas tank.

The substrate S, on which the thin film is formed in the sputter device 100, is carried out from the vacuum chamber 10 by the substrate transferring unit 20, and is transferred to the dry etching device 200. The dry etching device 200 selectively removes the thin film formed on the substrate S so as to execute the etch process forming a semiconductor integrated circuit.

The EPD device 210 is installed in the dry etching device 200, and detects the etch end point through a method such as light detection, current detection, and temperature detection, which are well known. The EPD device 210 ma detect the etch time from the etch end point of the thin film, thereby generating the EPD information including the etch time information. On the other hand, the etch rate of the dry etching device 200 is uniform and may be correctly controlled. The etch rate of the dry etching device 200 is included in the EPD information and may be transmitted to the controller 300. Also, the EPD information may further include an offset for compensating for a deviation amount of the thickness of the thin film which is etched in the dry etching device 200. The EPD device 210 generates the EPD information and transmits it to the controller 300.

The controller 300 calculates the deposition time by using the EPD information, and controls the sputter device 100 relative to the thickness of the thin film formed on the substrate S based on the calculated deposition time so as to be uniformly maintained. In detail, the controller 300 calculates the thickness of the thin film formed on the first substrate from the etch time information included in the EPD information from the EPD device 210, and calculates the deposition time for the second substrate from the thickness of the thin film formed on the first substrate. The deposition time of the second substrate is the deposition time for the thin film to be formed on the second substrate with the same thickness as the thickness of the thin film formed on the first substrate. The controller 300 may calculate the deposition time for the second substrate by considering the process variables such as the power amount of the power supply unit 40, the introduction amount of the sputter gas (and the reactive gas) of the gas supplying unit 50, the vacuum pressure formed by the vacuum exhausting unit 60, and the distance between the target 31 and the substrate. The sputtering for the second substrate is executed according to the calculated deposition time. A detailed description thereof will be presented with reference to FIG. 2.

Figure 2:
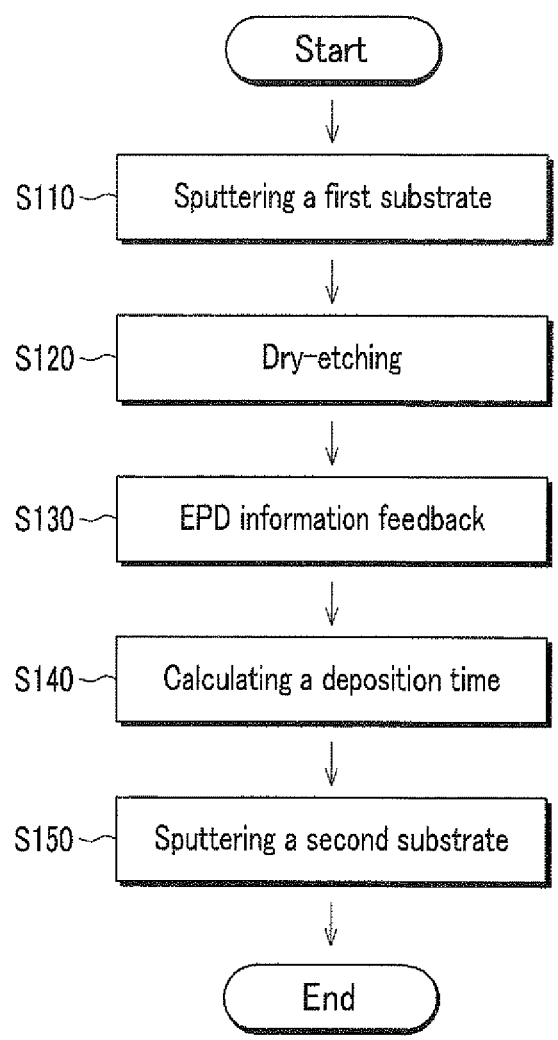
FIG. 2 is a flowchart showing a method of executing sputtering in a sputtering system according to an exemplary embodiment of the present invention.

FIG. 2 is a flowchart showing a method of sputtering in a sputtering system according to an exemplary embodiment of the present invention.

Referring to FIG. 2, the sputtering for the first substrate is executed (S110). The first substrate is a substrate on which the sputtering is initially executed in the sputtering system, or a substrate on which the sputtering is executed according to the deposition time calculated from the EPD information for the substrate on which the sputtering is initially executed. When there is no substrate on which the sputtering is initially executed, the sputtering for the first substrate is executed during a predetermined deposition time.

The sputtering process includes the following steps: (1) carrying the substrate to the vacuum chamber; (2) forming the vacuum pressure; (3) introducing the process gas; (4) applying the power; and (5) forming the thin film, etc.

The substrate transferring unit 20 carries the first substrate to a position facing the target 31 inside the vacuum chamber 10. Here, the first substrate is cleaned through a cleansing process before it is carried into the vacuum chamber 10. The cleansing process is executed with a sequence of soapy water cleansing, distilled water ultrasonic wave cleansing, diachronic acid solution precipitation, high purity ethanol ultrasonic wave cleansing, and anhydrous methanol ultrasonic wave cleansing.

The inside of the vacuum chamber 10 is provided with a predetermined vacuum pressure by the vacuum exhausting unit 60. For example, a rotator pump may be operated to form a vacuum pressure of about $10^{-3}$ Torr inside the vacuum chamber 10, and then the turbomolecular pump may be operated to form a vacuum pressure of 10-7 Torr inside the vacuum chamber 10.

The gas supplying unit 50 introduces the process gas into the vacuum chamber 10. The mass flow controller 52 flows the sputter gas (and the reactive gas) in a predetermined amount inside the vacuum chamber 10.

The power supply unit 40 applies the AC power of predetermined frequency to the plurality of targets 31. The plurality of targets 31 are alternately converted into the anode electrode and the cathode electrode by the AC power such that a glow discharge is generated and a plasma atmosphere is formed. The ions are accelerated toward the target of the cathode electrode in the plasma atmosphere and are impacted. The sputter particles are scattered in the impacted target by the ions.

The scattered sputter particles are deposited on the first substrate during the predetermined deposition time, thereby forming the thin film. The first substrate, in which the formation of the thin film is finished, is carried out to the dry etching device 200.

A dry etching process for forming the semiconductor integrated circuit on the first substrate is executed in the dry etching device 200 (S120). Here, the EPD device 210 detects the etch ending point for the first substrate to generate the EPD information of the first substrate. The EPD information for the first substrate includes the etch time information in the etch process for the first substrate. The EPD information for the first substrate may further include etch-rate information.

The EPD device 210 feeds back the EPD information for the first substrate to the controller 300 (S130).

The controller 300 calculates the deposition time for the second substrate by using the EPD information of the first substrate (S140). The deposition time for the second substrate is the deposition time to form the thin film with the same thickness on the second substrate as the thickness of the thin film formed on the first substrate.

Equation 1 represents the correlation of the thickness of the thin film formed on the substrate by the sputtering and the process variables related thereto.

$$THIp = Coe1 \times Var1 + \ldots + Coen \times Varn + K \qquad \text{(Equation 1)}$$

In this regard, THIp is the thickness of the deposited thin film, Var1-Varn are process variables related to the thin film thickness, Coe1-Coen are coefficients of the process variable, and K is a constant. The process variables related to the thickness of the thin film formed on the substrate are the power amount of the power supply unit 40, the introduction amount of the sputter gas (and the reactive gas) of the gas supplying unit 50, the vacuum pressure formed by the vacuum exhausting unit 60, the distance between the target 31 and the substrate, the temperature inside the vacuum chamber 10, and the deposition time.

The other process variables, except for the deposition time, among the process variables related to the thickness of the thin film formed on the substrate may be converted into a unit of the thickness of the thin film and represented as a constant. Accordingly, the thickness of the thin film formed on the substrate may be represented by the deposition speed and the deposition time as in Equation 2.

Equation 2 represents the correlation between the thickness of the thin film formed on the substrate by the sputtering and the deposition time.

$$THIp = Vp \times Tp + \text{Offset1} \qquad \text{(Equation 2)}$$

In this regard, Vp is the deposition speed, Tp is the deposition time, Offset1 is the process variable offset of which the other process variables, except for the deposition time, among the process variables related to the thickness of the thin film in the sputtering process are converted into the unit of the thickness of the thin film. The deposition speed Vp and the Offset1 are previously determined according to the sputtering process environment. Accordingly, the thickness of the thin film formed on the substrate by the sputtering is proportional to the deposition time.

Equation 3 represents the correlation between the thickness of the thin film etched in the substrate by the dry etching and the etch time.

$$THIe = Ve \times Te + \text{Offset2} \qquad \text{(Equation 3)}$$

In this regard, THIe is the thickness of the etched thin film, Ve is the etch rate in the dry etching process, Te is the etch time, and Offset2 is the offset to compensate the deviation amount of the thin film thickness etched according to the passage of time in the dry etching process. The etch rate Ve and the Offset2 are previously determined according to the dry etching process. Accordingly, the thickness of the thin film etched in the substrate by the dry etching is proportional to the etch time. The etch time Te is the value calculated from the etch end point detected from the EPD device 210. The etch rate and the Offset2 information are included in the EPD information and are transmitted to the controller 300, or may be transmitted from the dry etching device 200 to the controller 300.

When the substrate formed with the thin film is the same as the etched substrate, that is, the thin film is formed on the first substrate, and the thin film formed on the first substrate is etched, it may be that THIp=THIe. That is, the thickness of the thin film etched in the first substrate by the dry etching is the same as the thickness of the thin film formed on the first substrate by the sputtering.

Accordingly, the deposition time in the sputtering process may be calculated from the etch time information by using Equations 2 and 3.

Equation 4 represents the correlation between the deposition time in the sputtering process and the etch time in the dry etching process.

$$Tp = (Ve \times Te + \text{Offset2} - \text{Offset1})/Vp \qquad \text{(Equation 4)}$$

The etch rate Ve and the Offset2 are previously determined according to the environment of the dry etching process, and the deposition speed Vp and the Offset1 are previously determined according to the environment of the sputtering. Accordingly, the deposition time Tp of the sputtering is determined according to the etch time Te of the dry etching process. That is, the deposition time for the second substrate is determined from the etch time for the first substrate.

The controller 200 of FIG. 1 may calculate the deposition time Tp from the etch time Te which is detected and transmitted in the EPD device 210 by using Equation 4. That is, the controller 200 calculates the thickness of the thin film formed on the first substrate from the etch time for the first substrate, and divides the calculated thickness of the thin film of the first substrate and the deviation of Offset1 by the deposition speed Vp, thereby calculating the deposition time Tp for the second substrate.

The sputtering for the second substrate is executed based on the calculated deposition time Tp for the second substrate (S150). The sputtering for the second substrate is executed with the same process as the sputtering for the first substrate, and the deposition time Tp which is calculated by the deposition time during which the scattered sputter particles are deposited on the second substrate to form the thin film is applied. That is, the process for forming the thin film on the substrate is executed during the deposition time which is calculated from the etch time information for the substrate which is executed with the previous sputtering (the previous substrate with respect to which the sputtering is executed).

As described above, the deposition time of the current sputtering process is calculated by using the etch time information for the previously sputtered substrate such that the thickness of the thin film formed on the substrate may be uniformly maintained.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A sputtering method, comprising:
    receiving etch time information for creation of a first substrate detected in a dry etching process;
    making a determination of a deposition time for creation of a second substrate from the etch time information for the first substrate; and
    executing sputtering for the second substrate based on the deposition time determined for creation of the second substrate.

2. The sputtering method of claim 1, wherein the etch time information is calculated from an etch end point detected by an end point detection (EPD) device.

3. The sputtering method of claim 1, wherein the determination of the deposition time is comprised of:

determining a thickness of a thin film formed on the first substrate from the etch time information; and determining the deposition time for the second substrate from the thickness of the thin film formed on the first substrate.

4. The sputtering method of claim 1, wherein the deposition time for the creation of the second substrate is a deposition time during which a thin film formed on the second substrate is formed with a same thickness as a thin film formed on the first substrate.

5. The sputtering method of claim 1, the deposition time for the second substrate being determined in dependence upon:

$$Tp=(Ve*Te+\text{Offset2}-\text{Offset1})/Vp,$$

where Tp is the deposition time for the second substrate,
Ve is an etch rate in the dry etching process,
Te is an etch time for the first substrate,
Vp is a deposition speed in the sputtering process,
Offset1 is a process variable offset of process variables, other than the deposition time, which are related to a thickness of a thin film in the sputtering process, and which are converted into a unit of the thickness of the thin film, and
Offset2 is an offset to compensate for a deviation amount of the thickness of the thin film etched according to a passage of time in the dry etching process.

6. The sputtering method of claim 5, wherein the process variables, other than the deposition time, include at least one of a power amount, introduction amount of a sputter gas, vacuum pressure inside a vacuum chamber, temperature inside the vacuum chamber, and distance between a target and the substrate.

7. A sputtering method, comprising:
carrying a substrate to a position facing a target inside a vacuum chamber;
forming a predetermined vacuum pressure inside the vacuum chamber;
introducing a process gas into the vacuum chamber;
applying predetermined power to the target; and
forming a thin film on the substrate during a deposition time which is determined from etch time information detected in a dry etching process.

8. The sputtering method of claim 7, wherein the etch time information is etch time information for a previous substrate which undergoes sputtering before the substrate.

9. The sputtering method of claim 8, wherein the etch time information for the previous substrate which undergoes sputtering is determined from an etch end point detected by an end point detection (EPD) device in the dry etching process and is transmitted.

10. The sputtering method of claim 8, wherein a thickness of the thin film formed on the substrate which previously undergoes sputtering is calculated in terms of the etch time information, and the deposition time is calculated by dividing a deviation between the calculated thickness of the thin film and a process variable offset of the sputtering process by a deposition speed.

11. The sputtering method of claim 10, wherein the process variable offset is an offset of which the other process variables, except for the deposition time, among the process variables in the sputtering process are converted into a unit of the thickness of the thin film.

12. A sputtering system, comprising:
a sputter device for executing a sputtering process for depositing a thin film on a substrate by a sputtering method;

an end point detection (EPD) device for generating EPD information, including etch time information for the substrate, for a calculation of a deposition time during which the thin film is deposited; and a controller for calculating a deposition time by using the EPD information, and for controlling the sputter device based on the calculated deposition time.

13. The sputtering system of claim 12, wherein the controller calculates a deposition time for a second substrate which will undergo sputtering from etch time information for a different substrate which previously executed with the sputtering.

14. The sputtering system of claim 13, wherein the controller calculates a thickness of the thin film formed on the different substrate from the etch time information for the different substrate, and divides a deviation between the calculated thickness of the thin film and a process variable offset of the sputtering process by a deposition speed for the calculation of the deposition time.

15. A sputtering system executing the sputtering method of claim 7, comprised of:
a sputter device for executing a sputtering process within the vacuum chamber by depositing a thin film on the substrate by the sputtering method;
an end point detection (EPD) device generating EPD information, including the etch time information corresponding to the substrate, for enabling a determination of a deposition time during which the thin film is deposited; and
a controller making the determination of a deposition time by using the EPD information, and enabling the formation of the thin film on the substrate by controlling the sputter device based on the deposition time determined.

16. The sputtering system of claim 15, wherein the controller makes a determination of a deposition time for creation of a second substrate which will undergo sputtering from etch time information corresponding to a different substrate previously subjected to the sputtering process.

17. The sputtering system of claim 16, wherein the controller makes a determination of a thickness of the thin film formed on the different substrate from the etch time information for the different substrate, and divides a deviation between the calculated thickness of the thin film and a process variable offset of the sputtering process by a deposition speed for the calculation of the deposition time.

18. The sputtering system of claim 16, the deposition time for the second substrate being determined in dependence upon:

$$Tp=(Ve*Te+\text{Offset2}-\text{Offset1})/Vp,$$

where Tp is the deposition time for the second substrate,
Ve is an etch rate in the dry etching process,
Te is an etch time for the first substrate,
Vp is a deposition speed in the sputtering process,
Offset1 is a process variable offset of process variables, other than the deposition time, which are related to a thickness of a thin film in the sputtering process, and which are converted into a unit of the thickness of the thin film, and
Offset2 is an offset to compensate for a deviation amount of the thickness of the thin film etched according to a passage of time in the dry etching process.

19. A sputtering system executed by the sputtering method of claim 1, comprised of:
a sputter device executing the sputtering process by depositing a thin film on the substrate by the sputtering method;

an end point detection (EPD) device generating EPD information, including etch time information for the substrate, to enable a determination of a deposition time to deposit the thin film; and a controller making the determination of the deposition time in dependence upon the EPD information, and controlling the sputter device in dependence upon the deposition time determined.

* * * * *